United States Patent
Yajima

(10) Patent No.: US 7,432,163 B2
(45) Date of Patent: Oct. 7, 2008

(54) METHOD OF MANUFACTURING SEMICONDUCTOR DEVICE THAT INCLUDES FORMING ADJACENT FIELD REGIONS WITH A SEPARATING REGION THEREBETWEEN

(75) Inventor: Tsukasa Yajima, Miyagi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 389 days.

(21) Appl. No.: 11/276,406

(22) Filed: Feb. 28, 2006

(65) Prior Publication Data
US 2006/0202273 A1 Sep. 14, 2006

(30) Foreign Application Priority Data
Mar. 11, 2005 (JP) .............................. 2005/069719

(51) Int. Cl.
*H01L 21/762* (2006.01)
(52) U.S. Cl. ........................ 438/275; 438/294; 438/424; 438/703; 257/E21.545
(58) Field of Classification Search ................ 438/294
See application file for complete search history.

(56) References Cited
U.S. PATENT DOCUMENTS
6,380,020 B1 * 4/2002 Shimizu ..................... 438/225

6,787,410 B2 * 9/2004 Iwata et al. .................. 438/221
2003/0134479 A1 * 7/2003 Salling et al. ................ 438/294
2003/0228725 A1 * 12/2003 Tsujikawa et al. ........... 438/197
2003/0235964 A1 * 12/2003 Wolstenholme et al. ..... 438/294

FOREIGN PATENT DOCUMENTS
JP 2000/150665 A 5/2000
JP 2000/200836 A 7/2000

* cited by examiner

*Primary Examiner*—Stephen W Smoot
(74) *Attorney, Agent, or Firm*—Rabin & Berdo, P.C.

(57) ABSTRACT

A method of manufacturing a semiconductor device comprises the steps of: preparing a semiconductor substrate, the semiconductor substrate having first and second predetermined regions; forming a first field region surrounding the first predetermined region; forming a second field region surrounding the second predetermined region while a separating region exists between adjacent first and second field regions; forming a first insulation film on the semiconductor substrate; forming a resist pattern on the first insulation film, the resist pattern covering the first predetermined region and a part of the separating region; exposing the second predetermined region by etching the first insulation film using the resist pattern as a mask; forming a second insulation film on the second predetermined region; and forming gate electrodes on the first and second insulation films.

18 Claims, 11 Drawing Sheets

METHOD OF MANUFACTURING SEMICONDUCTOR DEVICE THAT INCLUDES FORMING ADJACENT FIELD REGIONS WITH A SEPARATING REGION THEREBETWEEN

BACKGROUND OF THE INVENTION

1. Field of the Invention

The present invention relates to a method of manufacturing a semiconductor device, which in particular may have a high withstand voltage element and a low withstand voltage element mounted together on the same semiconductor substrate.

2. Background Information

In recent years, liquid crystal displays have prevailed in the fields of personal computers and televisions, and their rapid growth in these fields is remarkable. Moreover, as liquid crystal displays have come to be used in cellular phones, digital cameras etc, it is expected that there will be even more demands for them in the future.

A conventional liquid crystal panel requires high voltage in order to be operated. Therefore, a driver LSI for driving the liquid crystal panel needs high withstand voltage MOS (metal-oxide semiconductor) transistors. On the other hand, a logic circuit for digital processing needs an advanced logic process in order to obtain processing speed.

Generally, in the logic processor, low withstand voltage MOS transistors are used. As opposed to this, in the driver LSI, elements having both high withstand voltage MOS transistors and low withstand voltage MOS transistors mounted on the same semiconductor substrate are used.

Examples of general types of semiconductor devices having high withstand voltage MOS transistors and low withstand voltage MOS transistors mounted together on the same semiconductor substrate are exhibited in Japanese Laid-Open Patent Application No. 2000-150665 (hereinafter to be referred to as Patent Reference 1) and Japanese Laid-Open Patent Application No. 2000-200836 (hereinafter to be referred to as Patent Reference 2). FIG. 1A and FIG. 1B are diagrams showing structures of a general type of conventional semiconductor device 900.

FIG. 1A is a sectional view of the conventional semiconductor device 900 taken along a line I-I', and FIG. 1B is an overhead diagram of the semiconductor device 900. The I-I' section of FIG. 1A is a section of the line I-I' shown in FIG. 1B. Here, the same reference numbers are used for the same structural elements.

As shown in FIG. 1A and FIG. 1B, the semiconductor device 900 has a high withstand voltage MOS transistor region 900A and a low withstand voltage MOS transistor region 900B. A MOS transistor formed in the high withstand voltage MOS transistor region 900A (hereinafter to be referred to as high withstand voltage MOS transistor) has a gate oxide film 913*a* and a gate electrode 914 formed on a silicon substrate 911, sidewall spacers 916 formed on two sides of the gate electrode 914, and a pair of source/drain regions 915 sandwiching a region underneath the gate electrode 914 in the silicon substrate 911. On the other hand, like the high withstand voltage MOS transistor, a MOS transistor formed in the low withstand voltage MOS transistor region 900B (hereinafter to be referred to as low withstand voltage MOS transistor) has a gate oxide film 913*b* and a gate electrode 914 formed on the silicon substrate 911, sidewall spacers 916 formed on two sides of the gate electrode 914, and a pair of source/drain regions 915 sandwiching a region underneath the gate electrode 914 in the silicon substrate 911.

The high withstand voltage MOS transistor and the low withstand voltage MOS transistor are electrically separated from each other by a field oxide (a field oxide is also called an element isolating insulation film) 912 formed in the silicon substrate 911.

In the above structure, a boundary 900*a* between the high withstand voltage MOS transistor region 900A and the low withstand voltage MOS transistor region 900B is positioned on the field oxide 912.

Now, with reference to FIG. 2A to FIG. 3B, a method of manufacturing the semiconductor device 900 according to prior art will be explained. FIG. 2A to FIG. 3B show manufacturing processes focusing attention on the section of the line I-I' shown in FIG. 1B.

First, as shown in FIG. 2A, field oxides 912 are formed in the p-type silicon substrate 911 using a well known STI (Shallow Trench Isolation) method for instance. By this arrangement, active regions and field regions are defined in the surface of the silicon substrate 911.

Next, by conducting a thermal oxidation treatment on the surface of the silicon substrate 911, a gate oxide film 913 for the high withstand voltage MOS transistor is formed on the entire surface of the silicon substrate 911 as shown in FIG. 2B. Here, the gate oxide film 913 is normally formed to a thickness which is sufficient to not be damaged by an operating voltage. Generally, the gate oxide film 913 is formed to the thickness of around 30 to 50 nm (nanometer) for instance.

Next, by conducting a known photolithographic process, a resist pattern R901 is formed only in the high withstand voltage MOS transistor region 900A. Then, the gate oxide film 913 in the low withstand voltage MOS transistor region 900B is removed by a known etching method while using the resist pattern R901 as a mask. By this process, the gate oxide film 913A which is a part of the gate oxide film 913 remains only in the high withstand MOS transistor region 900A as shown in FIG. 2C. The resist pattern R901 remained on the gate oxide film 913A is removed after the etching process is over.

Next, by conducting a thermal oxidation treatment on the entire surface of the silicon substrate 911, a gate oxide film 913B for the low withstand voltage MOS transistor is formed in the low withstand voltage MOS transistor region 900B as shown in FIG. 2D. Here, the gate oxide film 913B is normally formed to a thickness which is decided depending on the operating voltage and performance expected from the low withstand voltage MOS transistor. Generally, the gate oxide film 913B is formed to a thickness of around 2 to 7 nm for instance.

Next, polysilicon is deposited on the entire surface of the silicon substrate 911 on which the gate oxide films 913A and 913B are formed, and processed by a known photolithographic method and an etching method to form the gate electrode 914 on the gate oxide film 913A in the high withstand voltage MOS transistor region 900A and the gate electrode 914 on the gate oxide film 913B in the low withstand voltage MOS transistor region 900B. Then, while using the gate electrodes 914 as masks, an etch back process is done on the entire surface of the silicon substrate 911 to remove the gate oxide films 913A and 913B except for the parts underneath the gate electrodes 914. By these processes, a structure shown in FIG. 3A can be obtained.

Next, an insulation film such as a silicon oxide film or a silicon nitride film is formed on the entire surface of the silicon substrate 911 using a known CVD (Chemical Vapor Deposition) method, after which an etch back process according to a known etching technique is performed on the insulation film to form the sidewall spacers 916 on the sides of the gate electrodes 914 respectively, as shown in FIG. 3B.

Next, arsenic (As) ions are implanted into the silicon substrate 911 while using the field oxides 912, gate electrodes 914 and the sidewall spacers 916 as masks, a pair of source/drain regions 915 are formed in the active region of each of the high withstand voltage MOS transistor region 900A and the low withstand voltage MOS transistor region 900B in a self-aligning manner, the pair of source/drain regions 915 being formed in a way sandwiching a region underneath the gate electrode 914 and the sidewall spacers 916.

Taking the processes described above, a semiconductor device having a low withstand voltage transistor and a high withstand voltage transistor formed on the same semiconductor substrate can be produced.

However, in the above-described conventional manufacturing method, it has been noted as a problem that a step is produced in the upper part of the field oxide in the boundary between the high withstand voltage MOS transistor region and the low withstand voltage MOS transistor region. This is because in the etching process of FIG. 2C, over etching to the extent of about several dozen percent of the thickness of the gate oxide film 913 is done for the purpose of preventing variations in thickness to be made in the gate oxide film 913B after etching process. Due to such over etching, the upper part of the field oxide 912 which is not covered by the resist pattern R901 is also etched as shown in FIG. 2C. As a result, a step is formed in the upper part of the field oxide 912 in the boundary between the high withstand voltage MOS transistor region 900A and the low withstand voltage MOS transistor region 900B as can be seen in FIG. 2C. Normally, this step is about 50 to 100 nm high, although it depends on the thickness of the gate oxide film 913.

Such a step can be a cause of defective printing in the photolithographic process in forming the gate electrode 914 in the later process, and can be a cause of etching residuals of the polysilicon film. In addition to that, since the field oxide 912 becomes thinner, leakages, for instance, between transistors and wirings may be caused (hereinafter to be referred to as inter-field leakage).

In the above described way, when there is a step in the upper part of the field oxide, problems such as open, short, leakage, etc. can occur, which leads to a problem in which normal operation of the semiconductor device becomes difficult.

In view of the above, it will be apparent to those skilled in the art from this disclosure that there exists a need for an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems and to provide a method of manufacturing a semiconductor device, which has a high withstand voltage element and a low withstand voltage element formed on the same semiconductor substrate and which does not form any step in a field oxide.

In accordance with a first aspect of the present invention, a method of manufacturing a semiconductor device comprises the steps of: preparing a semiconductor substrate, the semiconductor substrate having first and second predetermined regions; forming a first field region surrounding the first predetermined region; forming a second field region surrounding the second predetermined region while a separating region exists between adjacent first and second field regions; forming a first insulation film on the semiconductor substrate; forming a resist pattern on the first insulation film, the resist pattern covering the first predetermined region and a part of the separating region; exposing the second predetermined region by etching the first insulation film using the resist pattern as a mask; forming a second insulation film on the second predetermined region; and forming gate electrodes on the first and second insulation films.

In accordance with a second aspect of the present invention, a method of manufacturing a semiconductor device comprises the steps of: preparing a semiconductor substrate having first and second predetermined regions; forming a first element isolating insulation film encircling the first predetermined region; forming a second element isolating insulation film encircling the second predetermined region while a separating region exists between the first and second element isolating insulation films, the first and second element isolating insulation films being separated physically by the separating region; forming a first insulation film on the semiconductor substrate having the first and second element isolating insulation films; forming a protective film on the first insulation film; forming a resist pattern on the protective film, the resist pattern covering the protective film over the second predetermined region, and a part of the edge of the resist pattern being located over the separating region; exposing the first predetermined region and the first element isolating insulation film by etching the protective film and the first insulation film using the resist pattern as a mask; forming a second insulation film on the first predetermined region; exposing the second predetermined region and the second element isolating insulation film by etching the remaining protective film and the remaining first insulation film; forming a third insulation film on the second predetermined region; and forming gate electrodes on the second and third insulation films, respectively.

In accordance with a third aspect of the present invention, a semiconductor device has a semiconductor substrate having first and second active regions, a first field region encircling the first active region, a second field region encircling the second active region, a separating region physically separating the first and second regions, gate insulation films formed on the first and second regions, and gate electrodes formed on the gate insulation films.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

A first embodiment of the present invention will be described in detail with reference to the drawings.

Structure

Figure 1A:
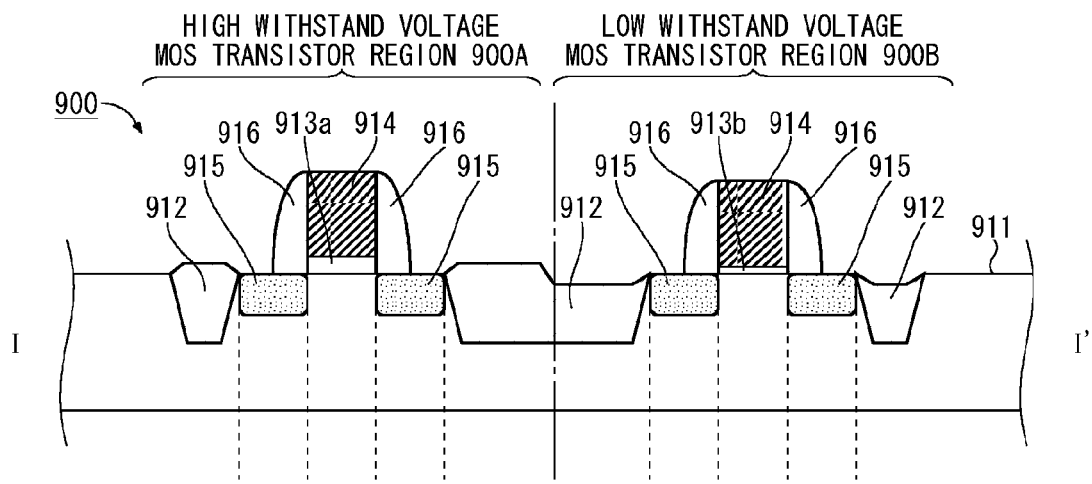
FIG. 1A and FIG. 1B are diagrams showing a structure of a semiconductor device 900 according to prior art.
Figure 1B:
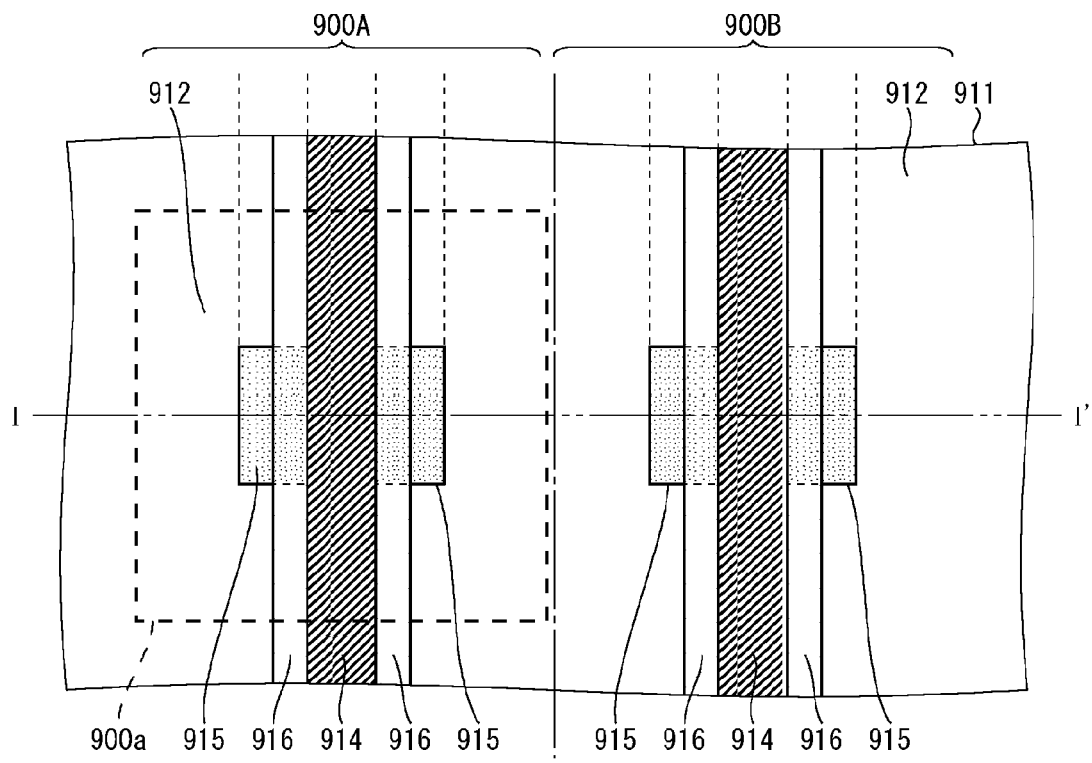
Figure 2A:
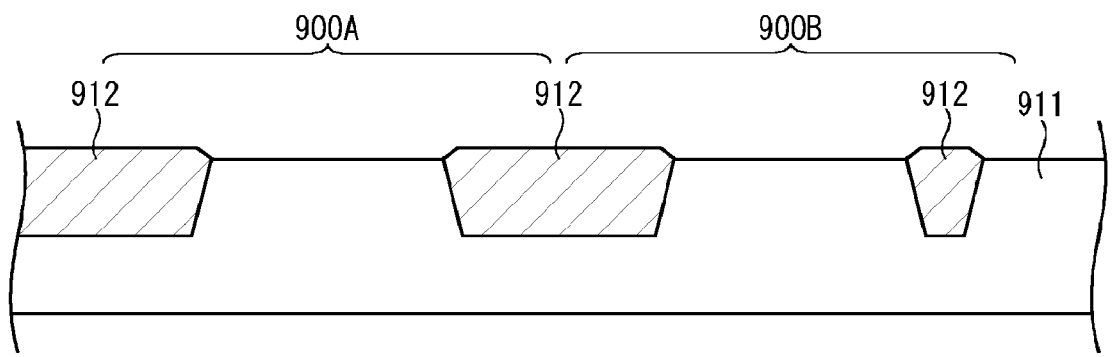
FIG. 2A to FIG. 2D are diagrams showing processes of forming the semiconductor device 900 according to a prior art manufacturing method.
Figure 2B:
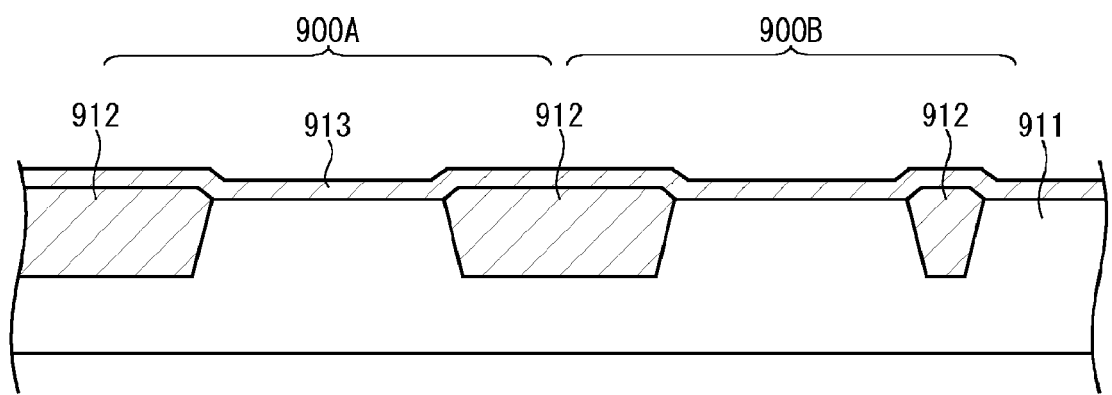
Figure 2C:
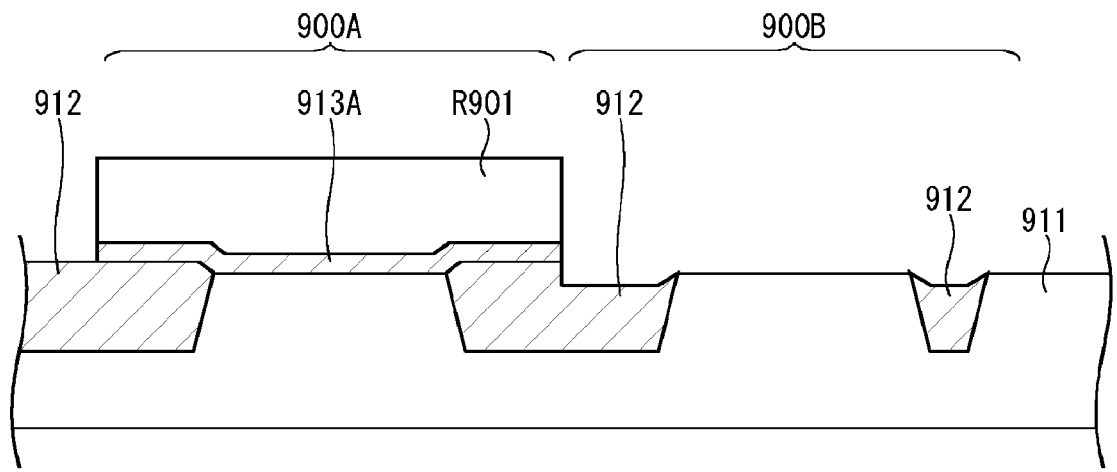
Figure 2D:
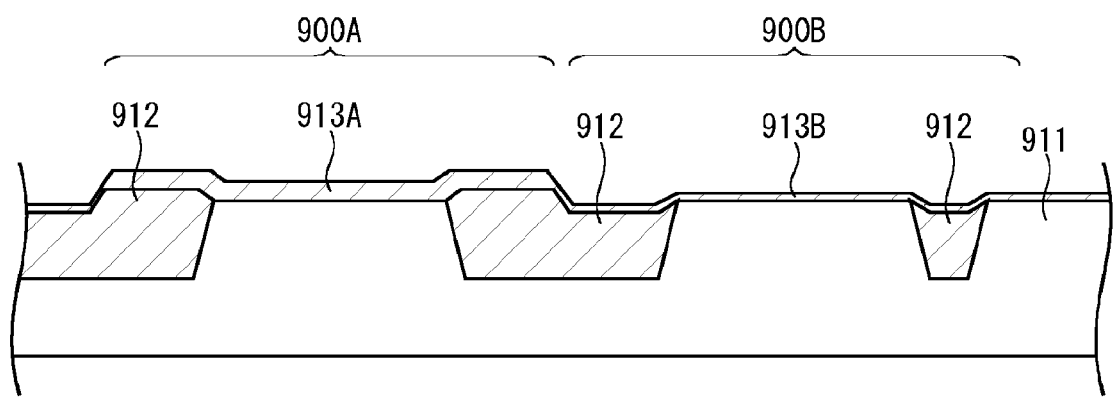
Figure 3A:
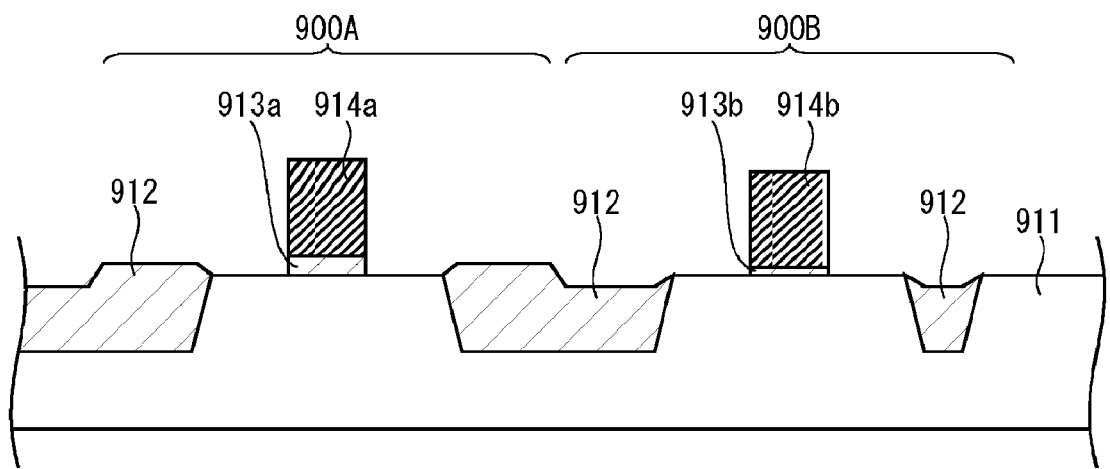
FIG. 3A and FIG. 3B are diagrams showing processes of forming the semiconductor device 900 according to the prior art manufacturing method.
Figure 3B:
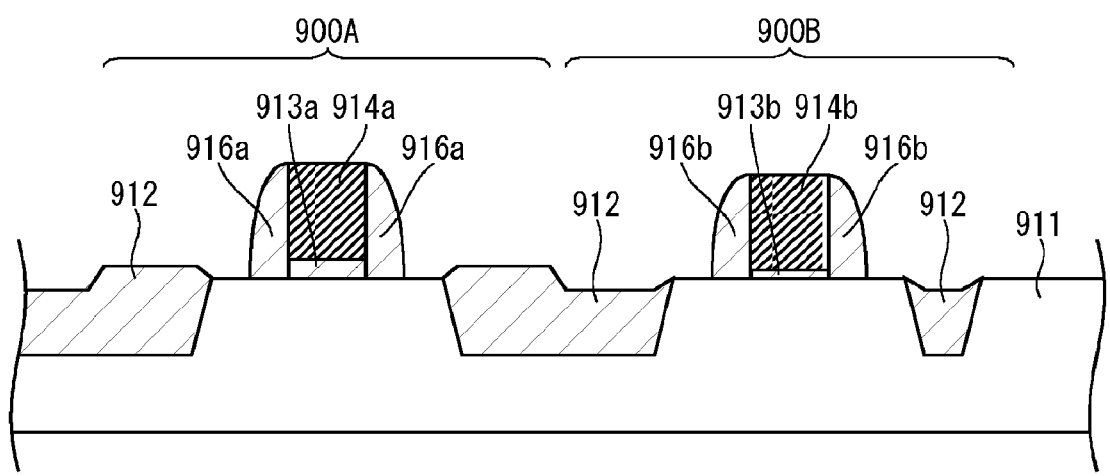
Figure 4A:
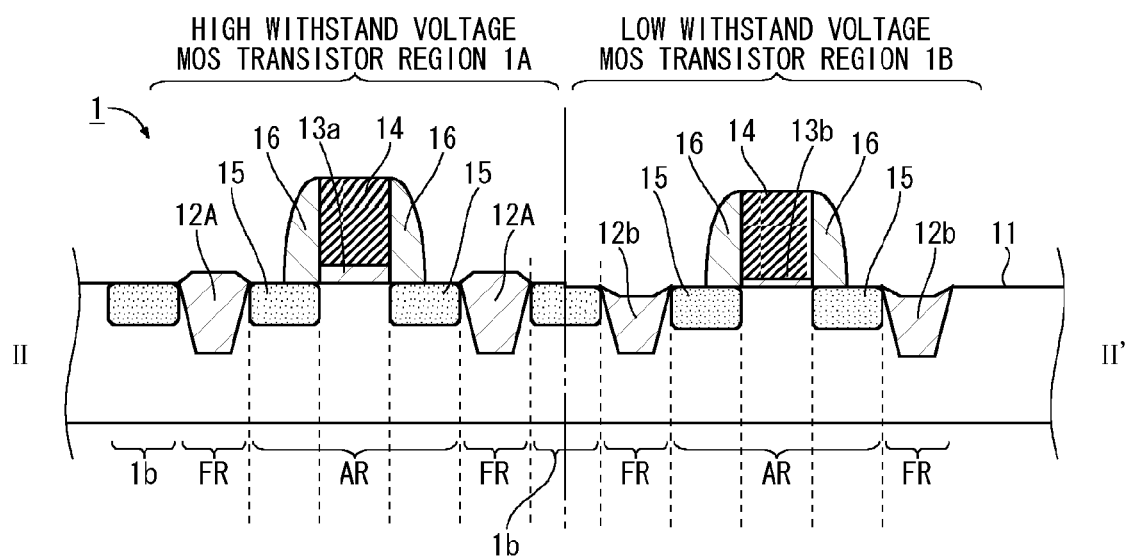
FIG. 4A and FIG. 4B are diagrams showing a structure of a semiconductor device 1 according to a first embodiment of the present invention.
Figure 4B:
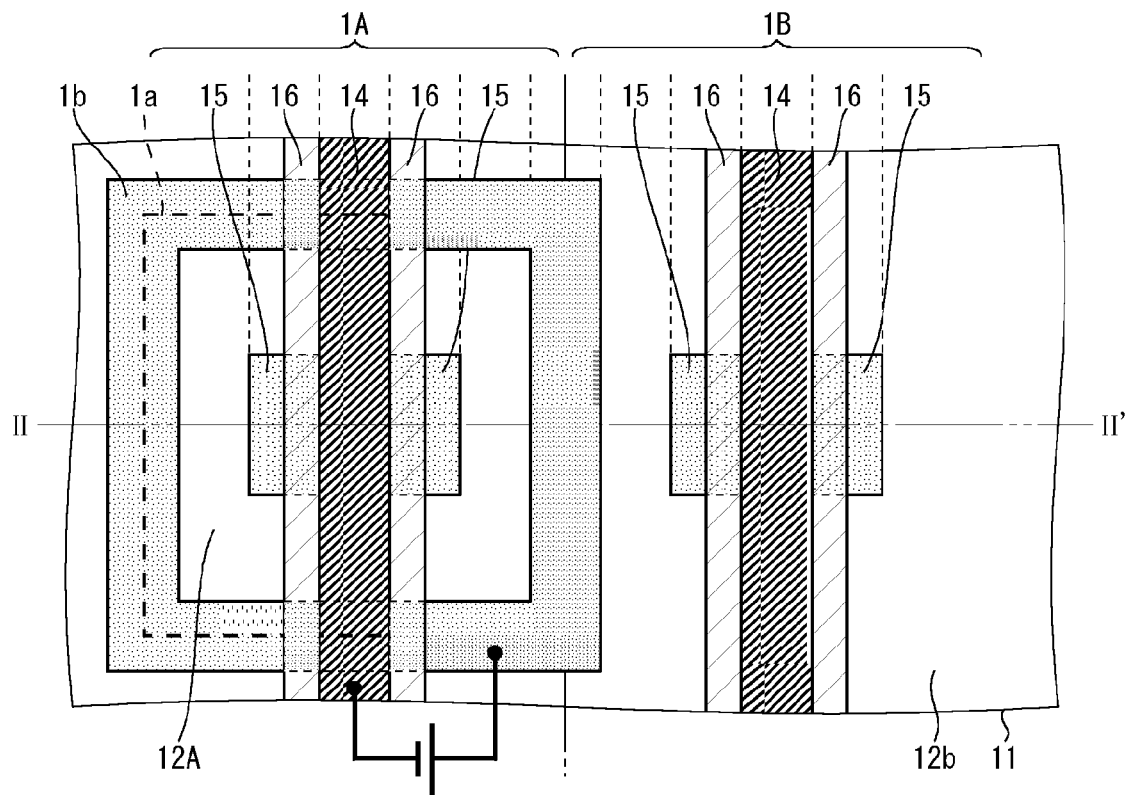

FIG. 4A is a sectional view of a semiconductor device 1 according to the first embodiment of the present invention taken along a line II-II', and FIG. 4B is an overhead diagram showing the semiconductor device 1. The II-II' section of FIG. 4A is a section of the line II-II' shown in FIG. 4B. Here, the same reference numbers are used for the same structural elements.

As shown in FIG. 4A and FIG. 4B, the semiconductor device 1 has a high withstand voltage MOS transistor region 1A and a low withstand voltage MOS transistor region 1B which are both semiconductor elements. An active region AR in the high withstand voltage MOS transistor region 1A is defined by being electrically separated from the other regions by field oxides 12A which are field regions FR. Likewise, an active region AR in the low withstand voltage MOS transistor region 1B is defined by being electrically separated from the other regions by field oxides 12b which are field regions FR.

A high withstand voltage MOS transistor formed in the high withstand voltage MOS transistor region 1A has a gate insulation film 13a and a gate electrode 14 formed on a silicon substrate 11, sidewall spacers 16 formed on two sides of the gate electrode 14, and a pair of source/drain regions 15 sandwiching a region underneath the gate electrode 14 in the silicon substrate 11. On the other hand, like the high withstand voltage MOS transistor, a low withstand voltage MOS transistor formed in the low withstand voltage MOS transistor region 1B has a gate insulation film 13b and a gate electrode 14 formed on the silicon substrate 11, sidewall spacers 16 formed on two sides of the gate electrode 14, and a pair of source/drain regions 15 sandwiching a region underneath the gate electrode 14 in the silicon substrate 11.

In the above structure, a p-type silicon substrate can be applied as the semiconductor substrate 11 for example. Furthermore, the field oxides 12A and 12b can be formed using an STI method for instance. However, the method of forming the field oxides 12A and 12b is not limited to the STI method, and can also be formed using a LOCOS (local oxidation of silicon) method for instance.

The gate insulation film 13a in the high withstand MOS transistor region 1A can be an insulation film such as a silicon oxide film for instance. The gate insulation film 13a should be formed to a thickness which is sufficient to not be damaged by an operating voltage, and such thickness may be around 30 to 50 nm for instance.

On the other hand, the gate insulation film 13b in the low withstand MOS transistor region 1B can be an insulation film such as a silicon oxide film for instance, as with the gate insulation film 13a. A thickness of the gate insulation film 13b can be decided depending on the operating voltage and performance expected from the low withstand voltage MOS transistor, and it may be set to around 2 to 7 nm for instance. The gate insulation film 13b is usually thinner than the gate insulation film 13a.

The gate electrodes 14 in the high withstand voltage MOS transistor region 1A and the low withstand voltage MOS transistor region 1B can be a polysilicon film including predetermined impurities, and they may be 200 to 300 nm thick for instance.

The sidewall spacers 16 formed on the sides of each gate electrode 14 can be insulation films such as silicon nitride films for instance. However, it is preferable that the sidewall spacers 16 are made of a material which can be etched selectively under predetermined conditions with respect to the gate insulation films 13a and 13b, field oxides 12A and 12b, and the semiconductor substrate 11. By choosing such material for the sidewall spacers 16, it is possible to form the sidewall spacers 16 without having to form any resist patterns or the like for protecting the semiconductor substrate 11, the sidewall spacers 16, the field oxides 12A and 12b, the gate electrode 15 and so forth. For example, the sidewall spacers 16 can be formed without requiring any resist patterns or the like, under the conditions that the semiconductor substrate 11 is a silicon substrate, the field oxides 12A and 12b are silicon oxide films, the gate insulation films 13a and 13b are silicon oxide films, the sidewall spacers 16 are silicon nitride films, and a mixed gas of $CHF_3$, Ar and $O_2$ with a mixture ratio of about 50:100:1 is used as an etching gas for processing the silicon nitride film formed on the semiconductor substrate 11.

In the active region AR of each of the high withstand voltage MOS transistor region 1A and the low withstand voltage MOS transistor region 1B, a pair of source/drain regions 15 are formed in the regions except the region underneath the gate electrode 14 and the sidewall spacers 16, and the source/drain regions 15 are formed in a way which sandwich this region underneath the gate electrode 14 and the sidewall spacers 16. In case of manufacturing a MOS transistor in which an n-type channel is formed, the source/drain regions 15 can be formed by implanting impurities having an n-type conductivity to the extent that the dose amount becomes around $2.0$ to $5.0 \times 10^{12}/cm^2$. Here, arsenic (As) ions, for instance, can be used as the n-type impurities. On the other hand, in case of manufacturing a MOS transistor in which a p-type channel is formed, the source/drain regions 15 can be formed by implanting impurities having a p-type conductivity to the extent that the dose amount becomes around 2.0 to $5.0\times10^{12}/cm^2$. Here, boron (B) ions, for instance, can be used as the p-type impurities.

In the above-described structure, as shown in FIG. 4A and FIG. 4B, the semiconductor device 1 has a semiconductor layer 1b between the field oxide 12A which defines the active region AR for the high withstand voltage MOS transistor region 1A and the field oxide 12b which defines the active region AR for the low withstand voltage MOS transistor region 1B. This semiconductor layer 1b is a region where the semiconductor substrate 11 is exposed, and it serves as a separating region which physically separates the field oxide 12A and the field oxide 12b. In this embodiment, a boundary 1a between the high withstand voltage MOS transistor region 1A and the low withstand voltage MOS transistor region 1B is positioned on the semiconductor layer 1b. Therefore, in this embodiment, in an exposure process in the manufacturing process of the semiconductor device 1 (which will be described later on) for instance, a photo mask with a layout enabling the boundary between the high withstand voltage MOS transistor region 1A and the low withstand voltage MOS transistor region 1B to be located on the semiconductor layer 1b, and suitable exposure conditions for such purpose, are used. Here, the boundary to be located onto the semiconductor layer 1b corresponds to the boundary 1a.

In this way, this embodiment realizes the structure in which the boundary 1a between the high withstand voltage MOS transistor region 1A and the low withstand voltage MOS transistor region 1B can be located on the semiconductor layer 1b, which is the exposed semiconductor substrate 11, but not on the field oxide, i.e. the silicon oxide film. Therefore, in this embodiment, for instance, in a gate insulation film patterning process (q.v. FIG. 5C) to be described later on, a boundary (which corresponds to 1a) between a region to be etched and a region not to be etched will not be disposed on the field oxide. As a result, it is possible to prevent any step from being formed in the upper part of the field oxide.

Furthermore, as it will be mentioned later on, the semiconductor layer 1b is a region where predetermined impurities are doped as with the active regions AR in the semiconductor substrate 11. Therefore, by applying a predetermined electric potential to the semiconductor layer 1b, possible inter-field leakage can be prevented.

Accordingly, by having the structure according to this embodiment, it is possible to realize the semiconductor device 1 which is capable of preventing wire disconnection which can be caused by defective printing in the photolithographic process, or in other words, the semiconductor device 1 which is capable of preventing problems such as occurrences of open, short, leakage, etc.

Manufacturing Method

Now, a method of manufacturing the semiconductor device 1 according to the first embodiment of the present invention will be described in detail with reference to the drawings. FIG. 5A to FIG. 6C are diagrams showing processes of manufacturing the semiconductor device 1 according to the first embodiment of the present invention. With respect to FIG. 5A to FIG. 6C, each process will be described in terms of a section taken along the line II-II' shown in FIG. 4B.

Figure 5A:
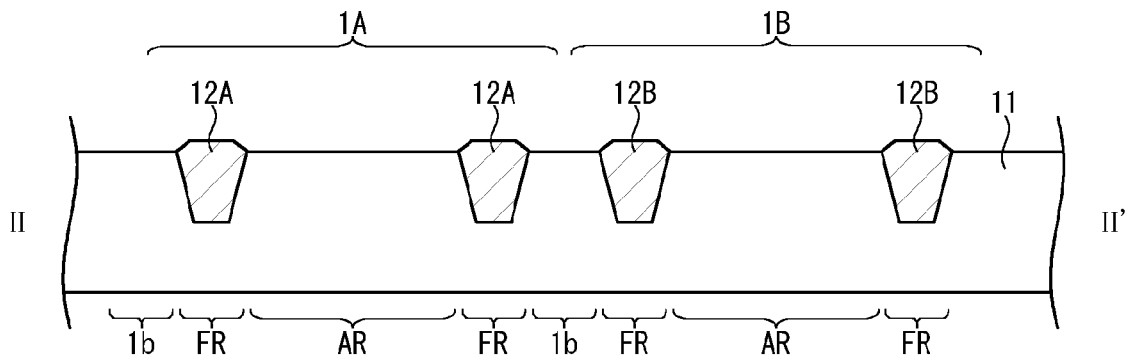
FIG. 5A to FIG. 5C are diagrams showing processes of forming the semiconductor device 1 according to a manufacturing method of the first embodiment of the present invention.

First, as shown in FIG. 5A, field oxides 12A and 12B are formed in the upper parts of the semiconductor substrate 11 using a known STI method for instance. Thereby, the active region AR in the high withstand voltage MOS transistor region 1A and the active region AR in the low withstand voltage MOS transistor region 1B are defined, and the semiconductor layer 1b which is an exposed semiconductor substrate 11 between the field oxides 12A and 12B (i.e. two field regions FR) is also defined. However, the method of forming the field oxides 12A and 12B is not limited to the STI method, but can also be a LOCOS method for instance.

Figure 5B:
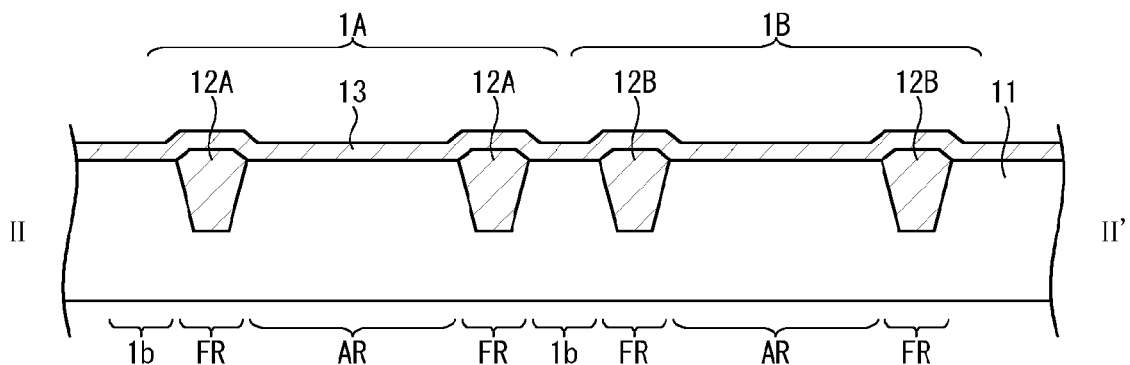
Figure 5C:
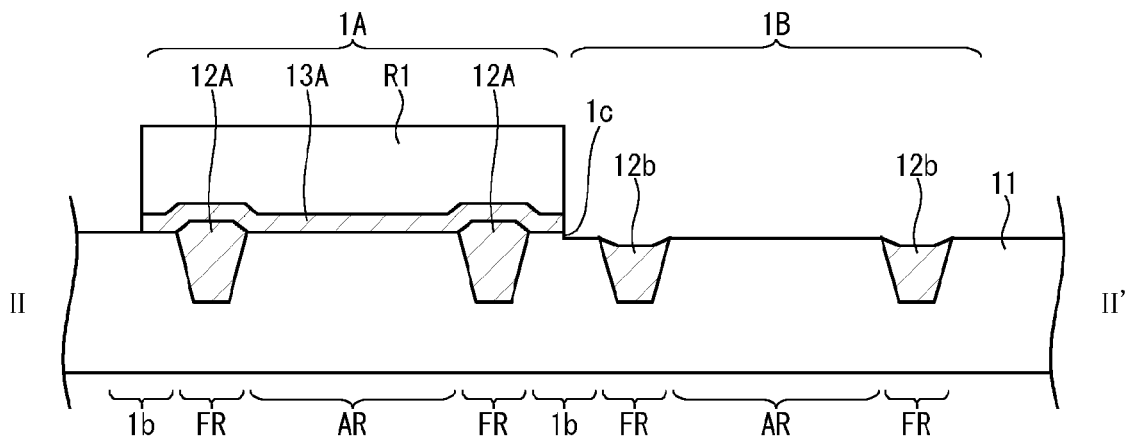

Next, by conducting a thermal oxidation treatment on the semiconductor substrate 11, as shown in FIG. 5B, a gate insulation film 13 which has the same thickness as the gate insulation film 13a for the high withstand voltage MOS transistor (e.g. around 30 to 50 nm) is formed on the whole upper surface of the semiconductor substrate 11. Here, as for the conditions of the thermal oxidation treatment, for instance, the temperature is set at 850° C. and the heating time is set to around 30 to 40 minutes.

Next, by conducting a known photolithographic process, a resist pattern R1 is formed only in the high withstand voltage MOS transistor region 1A. In this process, due to using a photo mask which enables the boundary 1a shown in FIG. 4B to be focused onto the semiconductor layer 1b, as shown in FIG. 5C, the side edge of the resist pattern R1 is located on the semiconductor layer 1b.

Next, by using a known etching method, the gate insulation film 13 in the low withstand voltage MOS transistor region 1B is removed. By this process, as shown in FIG. 5C, a gate insulation film 13A which is a part of the gate insulation film 13 remains only in the high withstand voltage MOS transistor region 1A. Here, in order to prevent the semiconductor substrate 11 from being damaged, it is preferable to use a wet etching method. In this wet etching process, for instance, the semiconductor substrate 11 having the gate insulation film 13 which is a silicon oxide film is soused in a hydrofluoric acid liquid of approximate 5% concentration for about 1 to 2 minutes. Moreover, in order to prevent etching residuals of the gate insulation film 13 from staying in the low withstand voltage MOS transistor region 1B, it is preferable to conduct over etching to the extent of about several dozen percent of the thickness of the gate insulation film 13. Here, an upper part of a field oxide in a region which is not covered by the resist pattern R1, i.e. the upper part of the field oxide 12B in the low withstand voltage MOS transistor region 1B, is also removed by this over etching. By this process, as shown in FIG. 5C, the field oxide 12b of which upper parts is etched is formed. In addition, in the wet etching process using a hydrofluoric acid liquid as an etchant, it is possible to selectively etch the silicon oxide film (i.e. the gate insulation film 13) with respect to the silicon substrate (i.e. the semiconductor substrate 11). In this process, however, the surface of the semiconductor substrate 11 is etched slightly in over etching. Accordingly, a minute step 1c is formed at the surface of the semiconductor substrate 11 as shown in FIG. 5C. After such etching process, the resist pattern R1 on the remained gate insulation film 13A is removed.

Figure 6A:
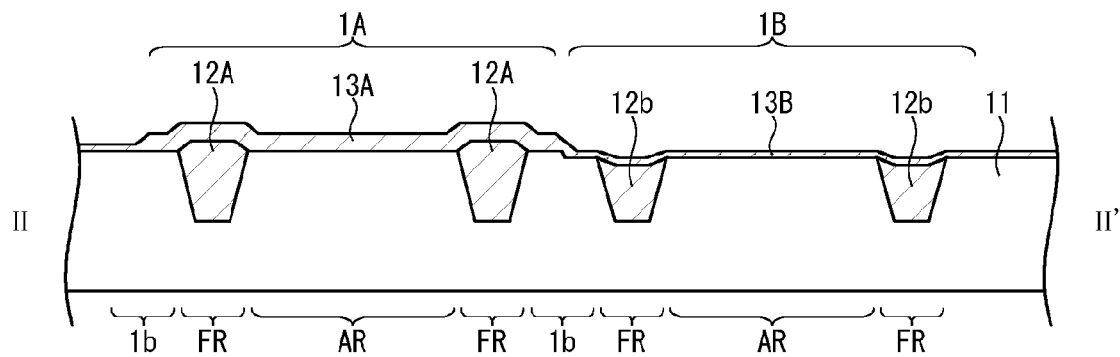
FIG. 6A to FIG. 6C are diagrams showing processes of forming the semiconductor device 1 according to the manufacturing method of the first embodiment of the present invention.
Figure 6B:
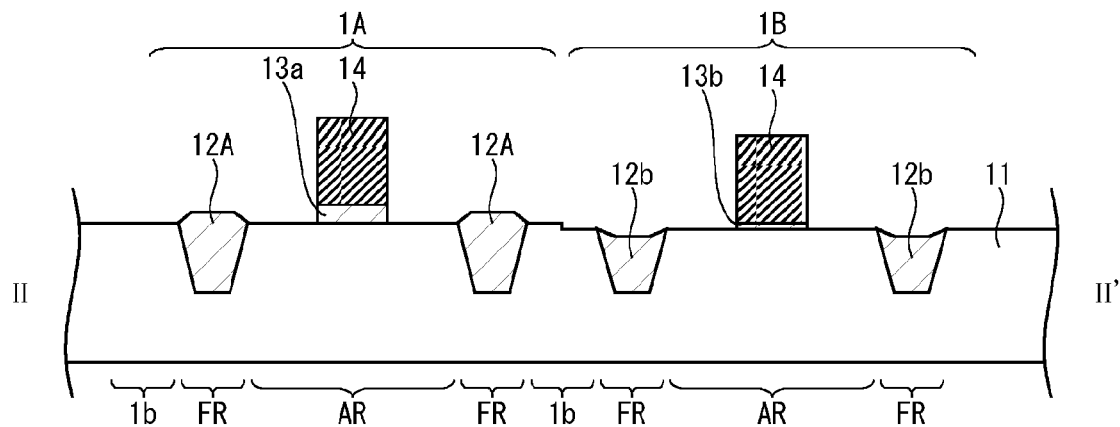

Next, by conducting a thermal oxidation treatment on the semiconductor substrate 11, a gate insulation film 13B for the low withstand voltage MOS transistor is formed in the low withstand voltage MOS transistor region 1B as shown in FIG. 6A. Here, the gate insulation film 13B is formed to a thickness which is decided depending on an operating voltage and performance expected from the low withstand voltage MOS transistor. For instance, the gate insulation film 13B is formed to the thickness of around 2 to 7 nm. As for the conditions of the thermal oxidation treatment, for instance, the temperature is set at 850° C. and the heating time is set to around 10 minutes.

Next, by depositing polysilicon over the entire surface of the semiconductor substrate 11 on which the gate insulation films 13A and 13B are formed, a polysilicon film having a thickness of about 200 to 300 nm, for instance, is formed over the semiconductor substrate 11. Then, by processing the polysilicon film using a known photolithographic method and a known etching method, gate electrodes 14 are formed on the gate insulation film 13A in the high withstand voltage MOS transistor region 1A and on the gate insulation film 13B in the low withstand voltage MOS transistor region 1B, respectively. Then, while using the gate electrodes 14 as masks, an etch back process is done on the entire surface of the silicon substrate 11 to remove the gate insulation films 13A and 13B except for the parts underneath the gate electrodes 14. By these processes, a structure shown in FIG. 6B can be obtained.

Figure 6C:
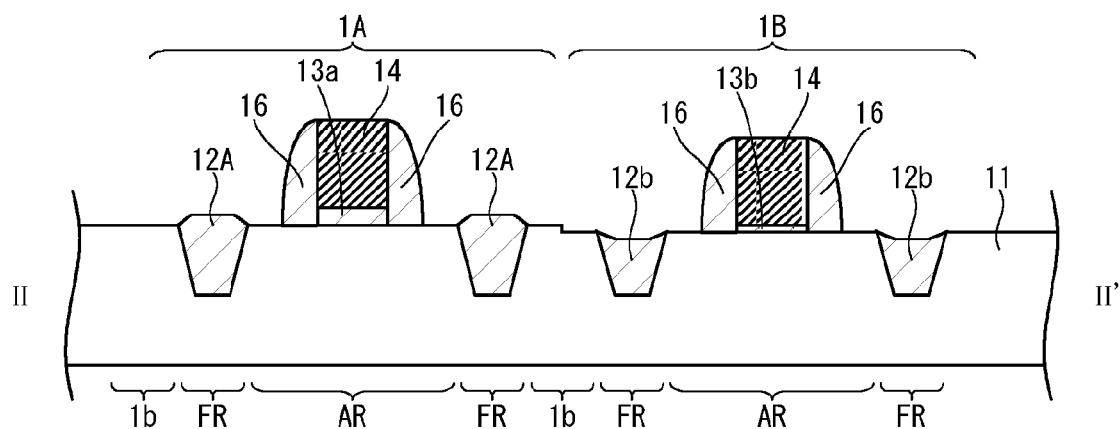

Next, an insulation film such as a silicon oxide film or a silicon nitride film is formed on the entire surface of the semiconductor substrate 11 using a known CVD method, after which an etch back process according to a known etching technique is performed on the insulation film to form sidewall spacers 16 on the sides of the gate electrode 14 respectively, as shown in FIG. 6C.

Next, arsenic (As) ions are implanted into the semiconductor substrate 11 while using the field oxides 12A and 12b, the gate electrodes 14 and the sidewall spacers 16 as masks, by which a pair of source/drain regions 15 are formed in the active region of each of the high withstand voltage MOS transistor region 1A and low withstand voltage MOS transistor region 1B in a self-aligning manner, the pair of source/drain regions 15 being formed in a way which sandwich a region undernearth the gate electrode 14 and the sidewall spacers 16, as shown in FIG. 4A. On the other hand, in order to form an electrode for controlling a substrate potential (which is also called a well potential), p-type impurities (e.g. boron (B) ions) are implanted into the semiconductor layer 1b. By this arrangement, the electrical conductivity of the semiconductor layer 1b can be improved.

Taking the processes described above, a semiconductor device 1 having the low withstand voltage MOS transistor and the high withstand voltage MOS transistor formed on the same semiconductor substrate 11 can be produced.

In the above-described way, according to this embodiment, the field oxide 12A is formed in a way encircling the active region AR in the high withstand voltage MOS transistor region 1A, the field oxide 12b is formed in a way encircling the active region AR in the low withstand voltage MOS transistor region 1B, and the semiconductor layer 1b being the equivalent of the active region is formed between adjacent high withstand MOS transistor region 1A and low withstand MOS transistor region 1B. In this structure, since the boundary 1a between the adjacent high withstand MOS transistor region 1A and low withstand MOS transistor region 1B is set on the semiconductor layer 1b, it is possible to prevent any step from being formed in the field oxides 12A and 12b which electrically separate the high withstand MOS transistor region 1A and the low withstand MOS transistor region 1B. By such structure, in the photolithographic process and the like which form the gate electrodes 14 made of polysilicon for instance, it is possible to prevent problems such as defective printing, etching residual of the polysilicon film, etc.

Moreover, since the semiconductor layer 1b being the equivalent of the active region AR is laid out in a way encircling the high withstand voltage MOS transistor region 1A (or the low withstand voltage MOS transistor region 1B), by applying an arbitrary potential to this semiconductor layer 1b, the possible occurrence of inter-field leakage can be prevented.

Due to such effects, problems such as occurrences of open, short, leakage, etc. can be prevented in a semiconductor device in which a high withstand voltage MOS transistor and a low withstand voltage MOS transistor are formed in a single semiconductor substrate.

Second Embodiment

A second embodiment of the present invention will be described in detail with reference to the drawings. In the following, for the structures that are the same as the first embodiment, the same reference numbers will be used, and redundant explanations of those structure elements will be omitted.

Structure

Figure 7A:
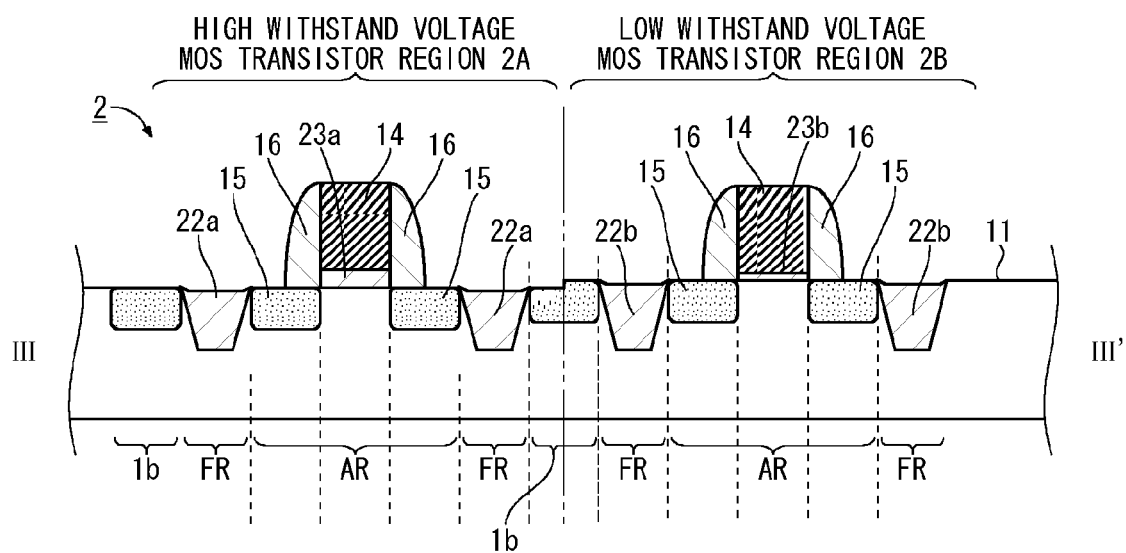
FIG. 7A and FIG. 7B are diagrams showing a structure of a semiconductor device 2 according to a second embodiment of the present invention.
Figure 7B:
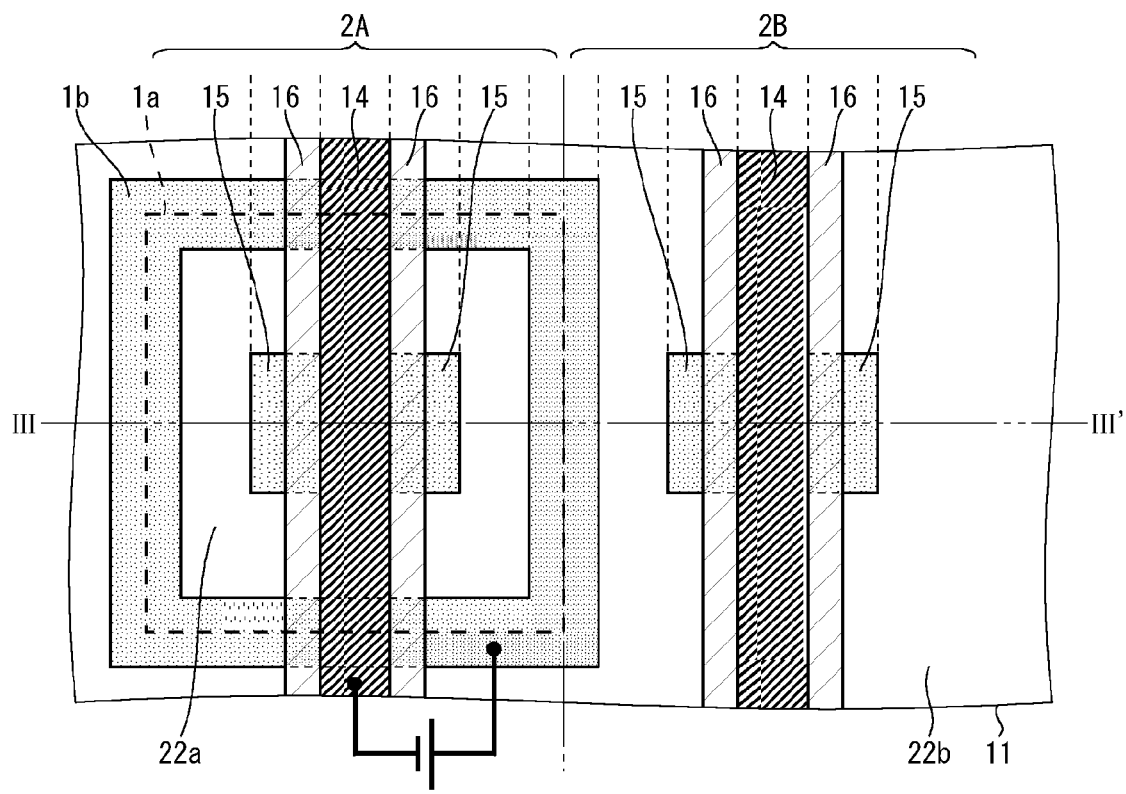

FIG. 7A is a sectional view of a semiconductor device 2 according to the second embodiment of the present invention taken along a line III-III', and FIG. 7B is an overhead diagram showing the semiconductor device 2. The III-III' section of FIG. 7A is a section of the line III-III' shown in FIG. 7B. Here, the same reference numbers are used for the same structural elements.

As shown in FIG. 7A and FIG. 7B, the semiconductor device 2 has a high withstand voltage MOS transistor region 2A and a low withstand voltage MOS transistor region 2B which are both semiconductor elements. An active region AR in the high withstand voltage MOS transistor region 2A is defined by being electrically separated from the other regions by field oxides 22a which are field regions FR. Likewise, an active region AR in the low withstand voltage MOS transistor region 2B is defined by being electrically separated from the other regions by field oxides 22b which are field regions FR.

A high withstand voltage MOS transistor formed in the high withstand voltage MOS transistor region 2A has the same structure as the high withstand voltage MOS transistor formed in the high withstand voltage MOS transistor region 1A in the first embodiment, and in the high withstand voltage MOS transistor in the second embodiment, the gate insulation film 13a is replaced with a gate insulation film 23a. On the other hand, like the high withstand voltage MOS transistor, a low withstand voltage MOS transistor formed in the low withstand voltage MOS transistor region 2B has the same structure as the low withstand voltage MOS transistor formed in the low withstand voltage MOS transistor region 1B in the first embodiment, and in the low withstand voltage MOS transistor in the second embodiment, the gate insulation film 13b is replaced with a gate insulation film 23b.

The gate insulation film 23a is substantially the same as the gate insulation film 13a in the first embodiment, but the formation process thereof differs from the formation process of the gate insulation film 13a. Likewise, the gate insulation film 23b is substantially the same as the gate insulation film 13b in the first embodiment, but the formation process thereof differs from the formation process of the gate insulation film 13b. These formation processes will be described later on in describing a manufacturing method, and therefore, detailed descriptions of those processes will be omitted in this past of the description.

Furthermore, in the semiconductor device 2 of the second embodiment, the field oxide 12A formed in the high withstand voltage MOS transistor region 1A in the semiconductor device 1 of the first embodiment is replaced with the field oxide 22a, and the field oxide 12b formed in the low withstand voltage MOS transistor region 1B in the semiconductor device 1 of the first embodiment is replaced with the field oxide 22b.

As can be seen from comparing FIG. 4A and FIG. 7A, unlike the field oxide 12A, an upper part of the field oxide 22a is removed and the amount removed in the field oxide 22a is less than that in the field oxide 12b. On the other hand, as can be seen from comparing FIG. 4A and FIG. 7A, the amount removed in the field oxide 22b is less than that in the field oxide 12b. These differences are provided by differences in the formation processes between the field oxides 12A and 12*b* and the field oxides 22*a* and 22*b*, respectively. These formation processes will be described later on as with the processes of the field oxides 22*a* and 22*b*.

As described above, in the second embodiment, it is possible to reduce the removing amounts in the field oxide 22*a* and 22*b*. Furthermore, in this embodiment, the field oxides 22*a* and 22*b* are formed by etching field oxides 22A and 22B, which will be described later on, subject to the thickness of the silicon oxide film 27, which will be described later on. Therefore, it is possible to conform the height of the upper face of the field oxide 22*a* in the high withstand voltage MOS transistor region 2A and the height of the upper face of the field oxide 22*b* in the low withstand voltage MOS transistor region 2B. Accordingly, in etching to remove a polysilicon film deposited over the field oxides 22*a* and 22*b* using a photolithographic method within the process of forming the gate electrode 14, which will be described later on, it is possible to spread a margin to cope with displacements and defocuses (this margin is also called an exposure margin).

Moreover, because the heights of the field oxides 22*a* and 22*b* are made even, it is possible to uniform the depths of contact holes formed over the gate electrodes 14 on the field oxides 22*a* and 22*b*. Accordingly, it is possible to spread a margin for etching conditions in forming the contact holes (this margin is also called an etching margin).

Since the rest of the structure is the same as the first embodiment, a detailed description thereof will be omitted here.

Manufacturing Method

Now, a method of manufacturing the semiconductor device 2 according to the second embodiment of the present invention will be described in detail with reference to the drawings. FIG. 8A to FIG. 10B are diagrams showing processes of manufacturing the semiconductor device 2 according to the second embodiment of the present invention. With respect to FIG. 8A to 10B, each process will be described in terms of a section taken along the line III-III' shown in FIG. 7B.

Figure 8A:
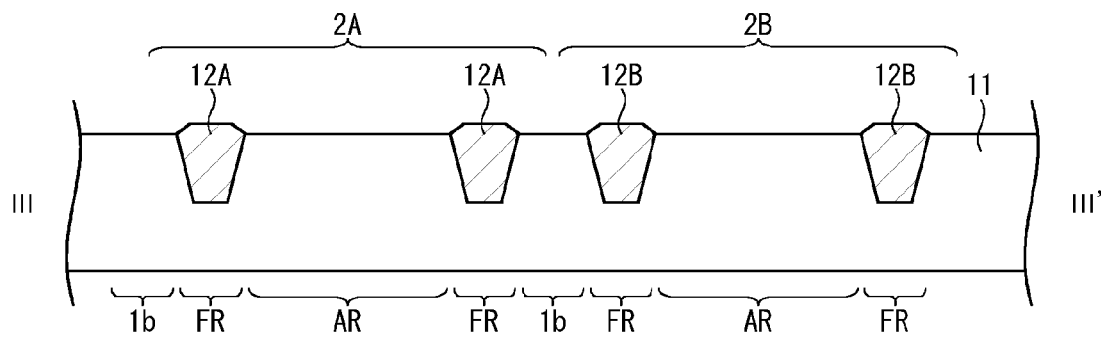
FIG. 8A to FIG. 8C are diagrams showing processes of forming the semiconductor device 2 according to a manufacturing method of the second embodiment of the present invention.
Figure 8B:
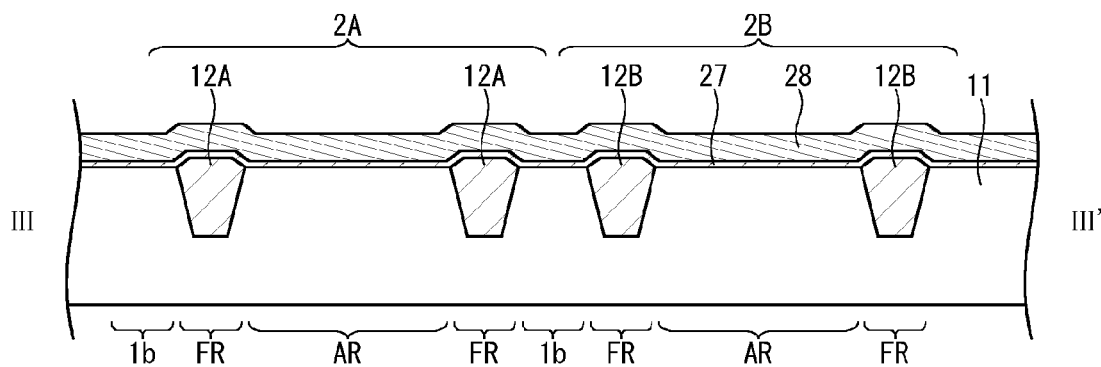

First, as shown in FIG. 8A, field oxides 12A and 12B are formed in upper parts of the semiconductor substrate 11 using a known STI method for instance. Thereby, the active region AR in the high withstand voltage MOS transistor region 2A and the active region AR in the low withstand voltage MOS transistor region 2B are defined, and the semiconductor layer 1*b* which is an exposed semiconductor substrate 11 between the field oxides 12A and 12B (i.e. two field regions FR) is also defined. However, the method of forming the field oxides 12A and 12B is not limited to the STI method, and can also be a LOCOS method for instance.

Next, by conducting a thermal oxidation treatment on the semiconductor substrate 11, a silicon oxide film 27 which is thinner than the gate insulation film 13*a* for the high withstand voltage MOS transistor (e.g. around 10 to 20 nm) is formed on the whole upper surface of the semiconductor substrate 11. Here, as for the conditions of the thermal oxidation treatment, for instance, the temperature is set at 850° C. and the heating time is set to around 20 minutes. Then, by depositing silicon nitride over the silicon oxide film 27 using a known CVD method for instance, a silicon nitride film 28 having a thickness of about 100 to 200 nm, for instance, is formed on the silicon oxide film 27. By these processes, a structure shown in FIG. 8B can be obtained. The silicon nitride film 28 is a protective film with respect to a thermal oxidation treatment which will be described later on reference to with FIG. 9A. Therefore, any thickness of the silicon nitride film 28 is applicable as long it is a sufficient thickness with which the silicon oxide film 28 can protect the semiconductor substrate 11 from the thermal oxidation treatment.

Next, by conducting a known photolithographic process, a resist pattern R2 is formed only in the low withstand voltage MOS transistor region 2B. In this process, as with the first embodiment, due to using a photo mask which enables the boundary 1*a* shown in FIG. 7B to be focused onto the semiconductor layer 1*b*, as shown in FIG. 8C, the side edge of the resist pattern R2 is located on the semiconductor layer 1*b*.

Next, by using a known etching method, the silicon nitride film 28 and the silicon oxide film 27 in the high withstand voltage MOS transistor region 2A is removed. By this process, as shown in FIG. 8C, a silicon nitride film 28B which is a part of the silicon nitride film 28 and a silicon oxide film 27B which is a part of the silicon oxide film 27 remain only in the low withstand voltage MOS transistor region 2B. Here, in order to prevent the semiconductor substrate 11 from being damaged, it is preferable to use a wet etching method. In this wet etching process, for instance, the silicon nitride film 28 is etched by sousing the semiconductor substrate 11 having the silicon nitride film 28 in a thermal phosphoric acid liquid at a temperature of around 160° C. for about 30 to 40 minutes. The silicon oxide film 27 is etched by sousing the semiconductor substrate 11 having the silicon oxide film 27 in a hydrofluoric acid liquid of approximate around 5% concentration for about 1 to 2 minutes. Moreover, in order to prevent etching residuals of the silicon oxide film 27 from staying in the high withstand voltage MOS transistor region 2A, it is preferable to conduct over etching to the extent of about several dozen percent of the thickness of the silicon oxide film 27. Here, an upper part of a field oxide in a region which is not covered by the resist pattern R2, i.e. the upper part of the field oxide 12A in the high withstand voltage MOS transistor region 2A, is also removed by this over etching. By this process, as shown in FIG. 8C, the field oxide 22*a* of which the upper part is etched is formed. However, since the thickness of the silicon oxide film 27 is thinner than the thickness of the gate insulation film 13 in the first embodiment (e.g. around 30 to 50 nm), and it may be around 10 to 20 nm for instance, the amount of the removed upper part of the field oxide 12A is larger than the amount of the removed upper part of the field oxide 12B which is removed in the etching process of the gate insulation film 13 in the first embodiment. That is, according to this embodiment, the amount of removed upper parts of field oxides can be reduced. In addition, in the wet etching using a thermal phosphoric acid liquid as an etchant, it is possible to selectively etch the silicon nitride film 28 with respect to the silicon oxide film 27. Therefore, in this wet etching process, it is possible to ignore the thinning of the silicon nitride film 28. Furthermore, in the wet etching process using a hydrofluoric acid liquid as an etchant, as with the first embodiment, it is possible to selectively etch the silicon oxide film 27 with respect to the silicon substrate (i.e. the semiconductor substrate 11). In this process, however, the surface of the semiconductor substrate 11 is etched slightly due to the over etching. Accordingly, a minute step 1*c* is formed at the surface of the semiconductor substrate 11 as shown in FIG. 8C. After such etching processes, the resist pattern R2 on the remained silicon oxide film 28 is removed.

Figure 9A:
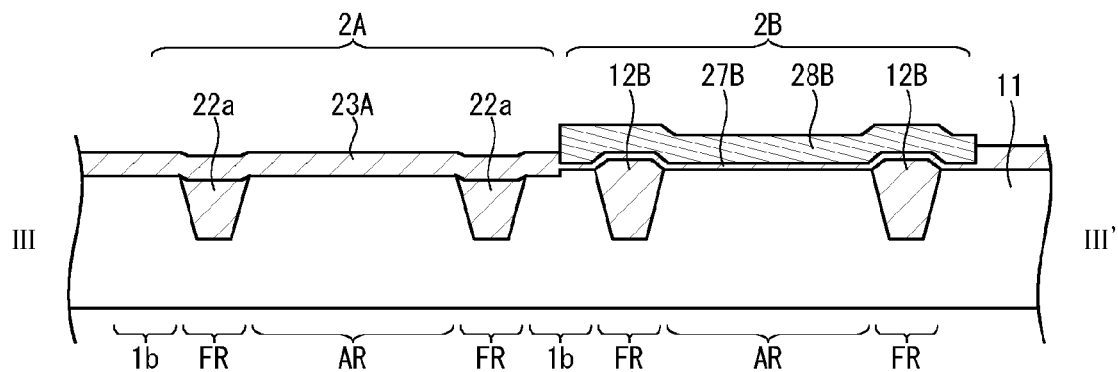
FIG. 9A to FIG. 9C are diagrams showing processes of forming the semiconductor device 2 according to the manufacturing method of the second embodiment of the present invention.

Next, by conducting a thermal oxidation treatment on the semiconductor substrate 11, a gate insulation film 23A for the high withstand voltage MOS transistor is formed in the high withstand voltage MOS transistor region 2A as shown in FIG. 9A. Here, considering that the gate insulation film 23A is to be thinned in the following process of etching the silicon oxide film 27B, the gate insulation film 23A should preferably be formed to a thickness that is thicker than a thickness that is sufficient to not be damaged by an operating voltage, by a portion of the gate insulation film 23A to be thinned in the etching process of the silicon oxide film 27B. The thickness sufficient to not be damaged by an operating voltage is around 30 to 50 nm for instance, and the portion of the gate insulation film 23A to be thinned in the etching process of the silicon oxide film 27B, in thickness, is around 11 to 22 nm for instance. Therefore, in this process, the gate insulation film 23A should preferably be formed to a thickness of around 41 to 52 nm for instance. In addition, in this process, the silicon nitride film 28B formed in the low withstand voltage MOS transistor region 2B functions as a protective film with respect to a thermal oxidation treatment. Therefore, the gate insulation film 23A should not be formed in the low withstand voltage MOS transistor region 2B and the silicon oxide film 27B should not be thickened. As for the conditions of the thermal oxidation treatment, for instance, the temperature is set at 850° C. and the heating time is set to around 30 to 40 minutes.

Figure 8C:
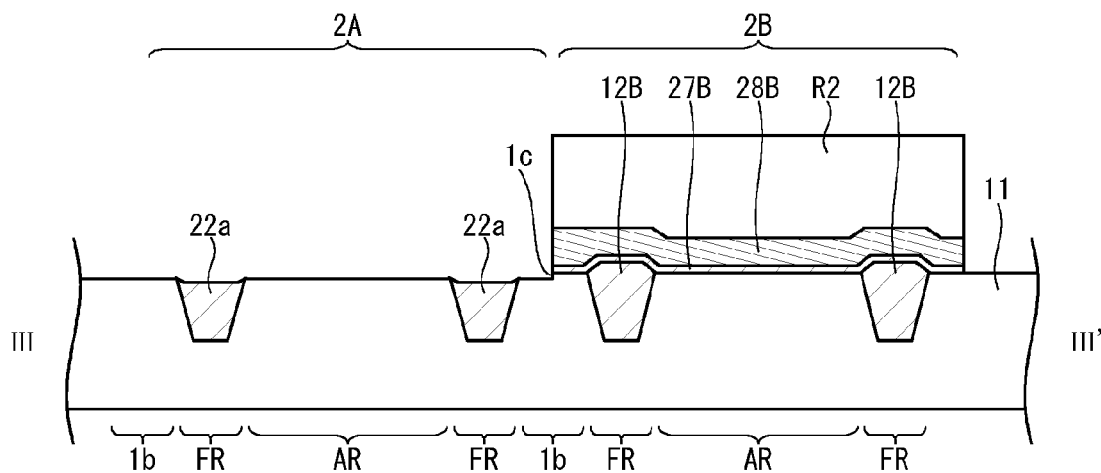
Figure 9B:
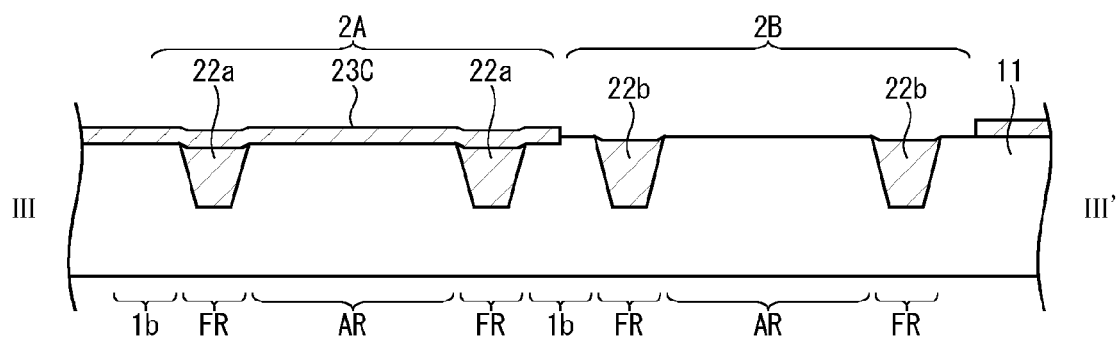
Figure 9C:
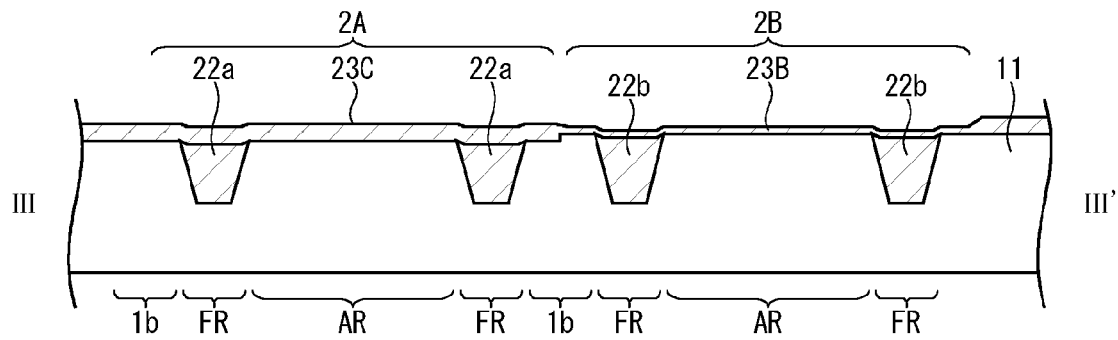

Next, the silicon nitride film 28B and silicon oxide film 27B remaining in the low withstand voltage MOS transistor region 2B are removed using the same wet etching method as in the process explained referring to FIG. 8C. Thereby, the semiconductor substrate 11 in the low withstand voltage MOS transistor region 2B is exposed as shown in FIG. 9B. In this process, the gate insulation film 23A is also etched. Thereby, a gate insulation film 23C having a desired thickness (e.g. around 30 to 50 nm) is formed in the high withstand voltage MOS transistor region 2A as shown in FIG. 9B. Furthermore, in this process, an upper part of the field oxide 12B is removed by the over etching described above. Thereby, the field oxide 22b in which the upper part is etched is formed. However, as described above, since the thickness of the silicon oxide film 27 is thinner than the thickness of the gate insulation film 13 in the first embodiment (e.g. around 30 to 50 nm), and it may be around 10 to 20 nm for instance, the amount of the removed upper part of the field oxide 12B is larger than the amount of the removed upper part of the field oxide 12B which is removed in the etching process of the gate insulation film 13 in the first embodiment. That is, according to this embodiment, the amount of the removed upper parts of the field oxides can be reduced. Moreover, according to this embodiment, it is possible to conform the removing thicknesses between the field oxides 12A and 12B. That is, it is possible to conform the height of the upper face of the field oxide 22a in the high withstand voltage MOS transistor region 2A and the height of the upper face of the field oxide 22b in the low withstand voltage MOS transistor region 2B.

Next, by conducting a thermal oxidation treatment on the semiconductor substrate 11, a gate insulation film 23B for the low withstand voltage MOS transistor is formed in the low withstand voltage MOS transistor region 2B as shown in FIG. 9A. Here, as with the first embodiment, the gate insulation film 23B is formed to a thickness which is decided depending on the operating voltage and performance expected from the low withstand voltage MOS transistor. For instance, the gate insulation film 13B is formed to a thickness of around 2 to 7 nm. As for the conditions of the thermal oxidation treatment, for instance, the temperature is set at 850° C. and the heating time is set to around 10 minutes.

Next, by depositing polysilicon over the entire surface of the semiconductor substrate 11 on which the gate insulation films 23C and 23B are formed, a polysilicon film having a thickness of about 200 to 300 nm, for instance, is formed over the semiconductor substrate 11. Then, by processing the polysilicon film using a known photolithographic method and a known etching method, gate electrodes 14 are formed on the gate insulation film 23C in the high withstand voltage MOS transistor region 2A and on the gate insulation film 23B in the low withstand voltage MOS transistor region 2B, respectively. Then, while using the gate electrodes 14 as masks, an etch back process is done on the entire surface of the silicon substrate 11 to remove the gate insulation films 23C and 23B except for the parts underneath the gate electrodes 14. By these processes, a structure shown in FIG. 10A can be obtained.

Figure 10A:
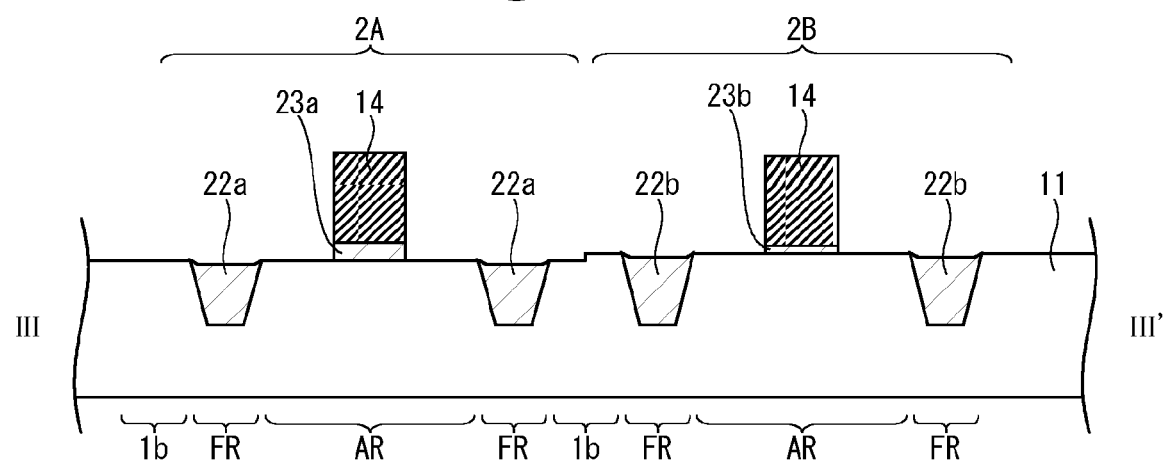
FIG. 10A and FIG. 10B are diagrams showing processes of forming the semiconductor device 2 according to the manufacturing method of the second embodiment of the present invention.
Figure 10B:
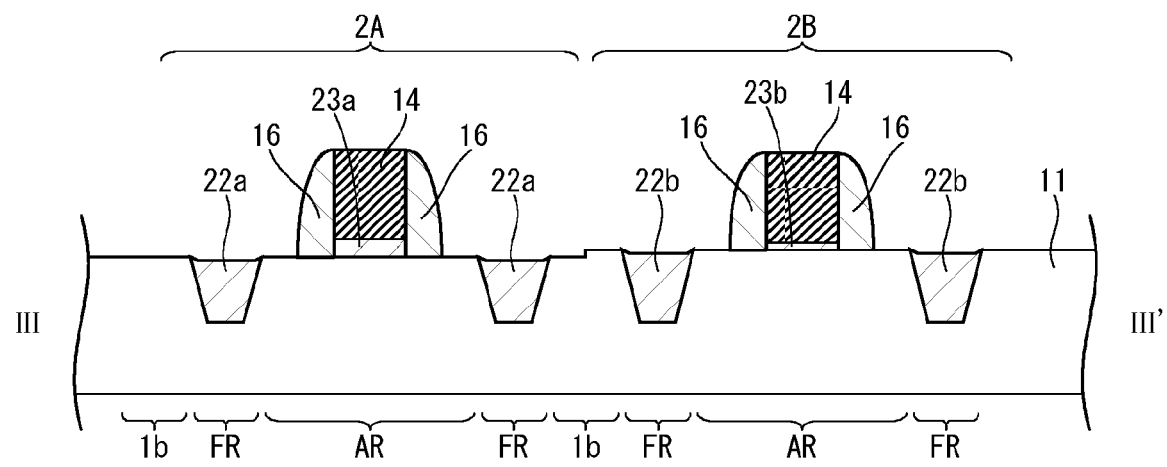

Next, an insulation film such as a silicon oxide film or a silicon nitride film is formed on the entire surface of the semiconductor substrate 11 using a known CVD method, after which an etch back process according to a known etching technique is performed on the insulation film to form sidewall spacers 16 on the sides of the gate electrode 14 respectively, as shown in FIG. 10B.

Next, arsenic (As) ions are implanted into the semiconductor substrate 11 while using the field oxides 22a and 22b, the gate electrodes 14 and the sidewall spacers 16 as masks, by which a pair of source/drain regions 15 are formed in the active region of each of the high withstand voltage MOS transistor region 2A and low withstand voltage MOS transistor region 2B in a self-aligning manner, the pair of source/drain regions 15 being formed in a way which sandwich a region undernearth the gate electrode 14 and the sidewall spacers 16, as shown in FIG. 7A. On the other hand, in order to form an electrode for controlling a substrate potential (which is also called a well potential), p-type impurities (e.g. boron (B) ions) are implanted into the semiconductor layer 1b. By this arrangement, the electrical conductivity of the semiconductor layer 1b can be improved.

Taking the processes described above, a semiconductor device 2 having the low withstand voltage MOS transistor and the high withstand voltage MOS transistor formed on the same semiconductor substrate 11 can be produced.

In the above-described way, according to this embodiment, the field oxide 22a is formed in a way encircling the active region AR in the high withstand voltage MOS transistor region 2A, the field oxide 22b is formed in a way encircling the active region AR in the low withstand voltage MOS transistor region 2B, and the semiconductor layer 1b that is the equivalent of the active region is formed between adjacent high withstand MOS transistor region 2A and low withstand MOS transistor region 2B. In this structure, since the boundary 1a between the adjacent high withstand MOS transistor region 2A and low withstand MOS transistor region 2B is set on the semiconductor layer 1b, it is possible to prevent any step from being formed in the field oxides 22a and 22b which electrically separate the high withstand MOS transistor region 2A and the low withstand MOS transistor region 2B. By such structure, in the photolithographic process and the like in forming the gate electrodes 14 made of polysilicon for instance, it is possible to prevent problems such as defective printing, etching residual of the polysilicon film, etc.

Moreover, since the semiconductor layer 1b that is the equivalent of the active region AR is laid out in a way encircling the high withstand voltage MOS transistor region 2A (or the low withstand voltage MOS transistor region 2B), by applying an arbitrary potential to this semiconductor layer 1b, the possible occurrence of inter-field leakage can be prevented.

Due to such effects, problems such as the occurrence of open, short, leakage, etc. can be prevented in a semiconductor device in which a high withstand voltage MOS transistor and a low withstand voltage MOS transistor are formed in a single semiconductor substrate.

Moreover, according to this embodiment, it is possible to reduce the removing amounts in the field oxide 22a and 22b. Furthermore, in this embodiment, the field oxides 22a and 22b are formed by etching field oxides 22A and 22B subject to the thickness of the silicon oxide film 27. Therefore, it is possible to conform the height of the upper face of the field oxide 22a in the high withstand voltage MOS transistor region 2A and the height of the upper face of the field oxide 22b in the low withstand voltage MOS transistor region 2B. Accordingly, in etching to remove a polysilicon film deposited over the field oxides 22a and 22b using a photolithographic method within the process of forming the gate electrode 14, it is possible to spread an exposure margin to cope with displacements and defocuses.

Moreover, because the heights of the field oxides 22a and 22b are made even, it is possible to uniform the depths of contact holes formed over the gate electrodes 14 on the field oxides 22a and 22b. Accordingly, it is possible to spread an etching margin for etching conditions in forming the contact holes.

Although the cases where an n-type high withstand voltage MOS transistor and an n-type low withstand voltage MOS transistor are mounted together on the same semiconductor substrate have been referred to in the above descriptions of the first and second embodiments, the present invention is not limited to this factor. For instance, by changing the impurities (ions) to be used, the present invention can be applied to a case where a p-type high withstand voltage MOS transistor and a p-type low withstand voltage MOS transistor are mounted together on the same semiconductor substrate, and a case where n-type and p-type high withstand voltage MOS transistors and n-type and p-type low withstand voltage MOS transistors are mounted together on the same semiconductor substrate.

Although the case where two kinds of MOS transistors (i.e. a high withstand voltage MOS transistor and a low withstand voltage MOS transistor) are mounted together on the same semiconductor substrate has been referred to in the above descriptions of the first and second embodiments, i.e. the case where two kinds of gate insulation films with different thicknesses are formed on the same semiconductor substrate, the present invention is not limited to this factor. For instance, the present invention can be applied to a case where more than three kinds of gate insulation films with different thicknesses are formed on the same semiconductor substrate.

Although the thermal oxidation treatment method is used for forming the gate insulation films (13, 13B, 23A and 23B) and silicon oxide film (27) in the above descriptions of the first and second embodiments, the present invention is not limited to this factor, and any method for forming a high resistance film having a desired thickness on the semiconductor substrate 11 can be applied as long as the formed film conforms to the spirit or the scope of the present invention.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-69719. The entire disclosures of Japanese Patent Application No. 2005-69719 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or portion of a device includes hardware and/or software that is constructed and/or programmed to carry out the desired function.

Moreover, terms that are expressed as "means-plus function" in the claims should include any structure that can be utilized to carry out the function of that portion of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A method of manufacturing a semiconductor device comprising:
   preparing a semiconductor substrate, the semiconductor substrate having first and second predetermined regions;
   forming a first field region surrounding the first predetermined region;
   forming a second field region surrounding the second predetermined region in spaced relation to the first field region, so as to define a separating region of the substrate between and adjacent to the first and second field regions;
   forming a first insulation film on the semiconductor substrate;
   forming a resist pattern on the first insulation film, the resist pattern covering the first predetermined region and a part of the separating region;
   exposing the second predetermined region by etching the first insulation film using the resist pattern as a mask;
   forming a second insulation film on the second predetermined region; and
   forming gate electrodes on the first and second insulation films.

2. The method of manufacturing a semiconductor device according to claim 1, wherein
   the separating region is a semiconductor layer.

3. The method of manufacturing a semiconductor device according to claim 1, wherein
   the first insulation film on the second predetermined region is removed by wet etching.

4. The method of manufacturing a semiconductor device according to claim 1, wherein
   the semiconductor substrate is a silicon substrate,
   the first insulation film is a silicon oxide film, and
   the first insulation film on the second predetermined region is removed by wet etching using a hydrofluoric acid liquid as an etchant.

5. The method of manufacturing a semiconductor device according to claim 1, wherein
   the first insulation film is an oxide film.

6. The method of manufacturing a semiconductor device according to claim 5, wherein
   the first insulation film is formed by a thermal oxidation treatment.

7. The method of manufacturing a semiconductor device according to claim 1, wherein
the separating region has a step.

8. A method of manufacturing a semiconductor device comprising:
preparing a semiconductor substrate having first and second predetermined regions;
forming a first element isolating insulation film encircling the first predetermined region;
forming a second element isolating insulation film encircling the second predetermined region while a separating region exists between the first and second element isolating insulation films, the first and second element isolating insulation films being separated physically by the separating region;
forming a first insulation film on the semiconductor substrate having the first and second element isolating insulation films;
forming a protective film on the first insulation film;
forming a resist pattern on the protective film, the resist pattern covering the protective film over the second predetermined region, and a part of the edge of the resist pattern being located over the separating region;
exposing the first predetermined region and the first element isolating insulation film by etching the protective film and the first insulation film using the resist pattern as a mask;
forming a second insulation film on the first predetermined region;
exposing the second predetermined region and the second element isolating insulation film by etching the remaining protective film and the remaining first insulation film;
forming a third insulation film on the second predetermined region; and
forming gate electrodes on the second and third insulation films, respectively.

9. The method of manufacturing a semiconductor device according to claim 8, wherein
the second insulation film is thicker than the first and third insulation films.

10. The method of manufacturing a semiconductor device according to claim 8, wherein
the first insulation film is etched by wet etching.

11. The method of manufacturing a semiconductor device according to claim 10, wherein
the semiconductor substrate is a silicon substrate,
the first insulation film is a silicon oxide film, and
the wet etching uses a hydrofluoric acid liquid.

12. The method of manufacturing a semiconductor device according to claim 8, wherein
the first predetermined region and the first element isolating insulation film are exposed by removing the protective film and the first insulation film by wet etching.

13. The method of manufacturing a semiconductor device according to claim 12, wherein
the semiconductor substrate is a silicon substrate,
the first insulation film is a silicon oxide film,
the protective film is a silicon nitride film, and
the wet etching uses a thermal phosphoric acid liquid for etching the protective film and a hydrofluoric acid liquid for etching the first insulation film.

14. The method of manufacturing a semiconductor device according to claim 8, wherein
the second predetermined region and the second element isolating insulation film are exposed by removing the protective film and the first insulation film by wet etching.

15. The method of manufacturing a semiconductor device according to claim 14, wherein
the semiconductor substrate is a silicon substrate,
the first insulation film is a silicon oxide film,
the protective film is a silicon nitride film, and
the wet etching uses a thermal phosphoric acid liquid for etching the protective film and a hydrofluoric acid liquid for etching the first insulation film.

16. The method of manufacturing a semiconductor device according to claim 15, wherein
the first to third insulation films are formed by a thermal oxidation treatment.

17. The method of manufacturing a semiconductor device according to claim 8, wherein
the first to third insulation films are oxide films.

18. The method of manufacturing a semiconductor device according to claim 8, wherein
a step is formed on the surface of the separating region.

* * * * *